(12) United States Patent
Yu

(10) Patent No.: US 11,061,615 B2
(45) Date of Patent: Jul. 13, 2021

(54) MEMORY SYSTEM, MEMORY CONTROLLER AND OPERATING METHOD THEREOF

(71) Applicant: SK hynix Inc., Gyeonggi-do (KR)

(72) Inventor: Hyung-Seok Yu, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/685,343

(22) Filed: Nov. 15, 2019

(65) Prior Publication Data

US 2020/0326887 A1  Oct. 15, 2020

(30) Foreign Application Priority Data

Apr. 9, 2019  (KR) .................. 10-2019-0041225

(51) Int. Cl.
  *G11C 16/08* (2006.01)
  *G06F 3/06* (2006.01)
  *G11C 16/26* (2006.01)

(52) U.S. Cl.
  CPC .......... *G06F 3/0659* (2013.01); *G06F 3/0619* (2013.01); *G06F 3/0653* (2013.01); *G06F 3/0679* (2013.01); *G11C 16/08* (2013.01); *G11C 16/26* (2013.01)

(58) Field of Classification Search
  CPC ............ G11C 16/3459; G11C 11/5628; G11C 11/5642; G11C 16/08; G11C 16/26; G11C 16/0483; G11C 16/10; G11C 16/34; G11C 16/3418; G11C 16/3427; G11C 11/56; G11C 16/04; G11C 29/02; G11C 29/44; G06F 3/0619; G06F 3/0653; G06F 3/0659; G06F 3/0679
  See application file for complete search history.

(56) References Cited

U.S. PATENT DOCUMENTS

2017/0243638 A1* 8/2017 Hsu .................... G11C 16/3459

FOREIGN PATENT DOCUMENTS

| KR | 10-2014-0020056 | 2/2014 |
| KR | 10-2016-0055309 | 5/2016 |

* cited by examiner

*Primary Examiner* — Thong Q Le
(74) *Attorney, Agent, or Firm* — IP & T Group LLP

(57) ABSTRACT

A memory system, a memory controller and an operating method thereof. The memory system includes a memory device including a plurality of memory blocks; and a memory controller configured to control the memory device. During an idle time, the memory controller searches for a target read bias for a first word line among a plurality of word lines in a first memory block of the memory device, and generates a history including the target read bias.

20 Claims, 14 Drawing Sheets

MEMORY SYSTEM, MEMORY CONTROLLER AND OPERATING METHOD THEREOF

CROSS-REFERENCE TO RELATED APPLICATION

The present application claims priority to Korean Patent Application No. 10-2019-0041225, filed on Apr. 9, 2019, which is incorporated herein by reference in its entirety.

BACKGROUND

1. Technical Field

Various embodiments generally relate to a memory system, a memory controller and an operating method thereof.

2. Related Art

A memory system stores data based on a request of a host, such as a computer, a mobile terminal such as a smartphone and a tablet, or various other electronic devices. The memory system may be a type that stores data in a magnetic disk, such as a hard disk drive (HDD), or a type that stores data in a nonvolatile memory, such as a solid state drive (SDD), a universal flash storage (UFS) device and/or an embedded MMC (eMMC) device.

The nonvolatile memory included in the memory system may include any of a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM).

The memory system may further include a memory controller for controlling a memory device. The memory controller may receive a command from the host, and may perform or control an operation for reading, writing or erasing data with respect to a volatile memory or a nonvolatile memory included in the memory system, based on the received command.

In a conventional memory system, a read fail may inevitably occur in the process of reading data from a memory device. When such a read fail occurs, a normal read operation for data cannot be efficiently performed. Therefore, a technology capable of preventing performance of the memory system from degrading when a read fail occurs, and at the same time enabling a read retry operation to be efficiently performed and properly completed, is demanded in the art.

SUMMARY

Various embodiments are directed to a memory system, a memory controller and an operating method thereof, capable of high speed data recovery when a read fail of data occurs.

Also, various embodiments are directed to a memory system, a memory controller and an operating method thereof, capable of quick and effective data recovery when a read fail of data occurs, by preemptively searching for an optimal target read bias for read retry of data.

Further, various embodiments are directed to a memory system, a memory controller and an operating method thereof, capable of preemptively searching for an optimal target read bias to be used in a future read operation, in consideration of a degradation state of a memory device of the memory system.

In one aspect, a memory system in accordance with embodiments may include a memory device including a plurality of memory blocks and a memory controller configured to control the memory device.

During an idle time, the memory controller may search for a target read bias for a first word line among a plurality of word lines in an optional first memory block of the memory device, and may generate a history including the searched target read bias.

The history may be generated by the unit of memory block.

Alternatively, the history may be generated by the unit of word line.

Alternatively, the history may be generated by the unit of word line group.

The first word line may correspond to an outermost word line among the plurality of word lines in the first memory block. Alternatively, the first word line may correspond to a word line adjacent to a dummy word line among the plurality of word lines in the first memory block.

When a read count value for the first memory block based on a read operation for one page in the first memory block is equal to or greater than a threshold value, the memory controller may search for the target read bias for the first word line in the first memory block, during the idle time.

The threshold value may be set to be smaller than a degradation-related read count value corresponding to the first memory block.

The memory controller may perform a read retry operation based on the target read bias by referring to the history upon a read fail for one page in the first memory block.

In another aspect, embodiments may provide a memory controller including a host interface configured to communicate with a host, a memory interface configured to communicate with a memory device, and a control circuit configured to control an operation of the memory device.

The operation of the memory device may include a read operation, a program operation or an erase operation.

The control circuit may include a firmware and a processor configured to execute the firmware.

During an idle time, the control circuit may search for a target read bias for a first word line among a plurality of word lines in a first memory block of the memory device, and may generate a history including the target read bias.

The target read bias may be a representative target read bias for the first memory block.

The target read bias may be an individual target read bias for the first word line.

The target read bias may be a representative target read bias for a word line group including the first word line.

In still another aspect, embodiments may provide a method for operating a memory controller, including searching for a target read bias for a first word line among a plurality of word lines in a first memory block of a memory device, during an idle time; and generating a history including the target read bias.

In still another aspect, embodiment may provide an operating method of a controller for controlling a memory device, determining, during an idle time, an optimal read bias for a target memory block having a greater read count than a threshold within the memory device; and controlling, upon a read fail on the target memory block, the memory device to perform a read retry operation to the target memory block based on the determined optimal read bias.

The embodiments may provide a memory system, a memory controller and an operating method thereof, capable of enabling high speed data recovery when a read fail of data occurs.

Also, the embodiments may provide a memory system, a memory controller and an operating method thereof, capable of enabling quick and effective data recovery when a read fail of data occurs, by preemptively searching for an optimal target read bias for read retry of data.

Further, the embodiments may provide a memory system, a memory controller and an operating method thereof, capable of preemptively searching for an optimal target read bias to be used in a read operation of data, in consideration of a degradation state of a memory device.

DETAILED DESCRIPTION

Features of various embodiments of the disclosure may be coupled, combined or separated partially or totally. Various interactions and operations are possible. Various embodiments can be practiced individually or in combination.

A memory system, a memory controller and an operating method thereof are described below with reference to the accompanying drawings through various embodiments.

Figure 1:
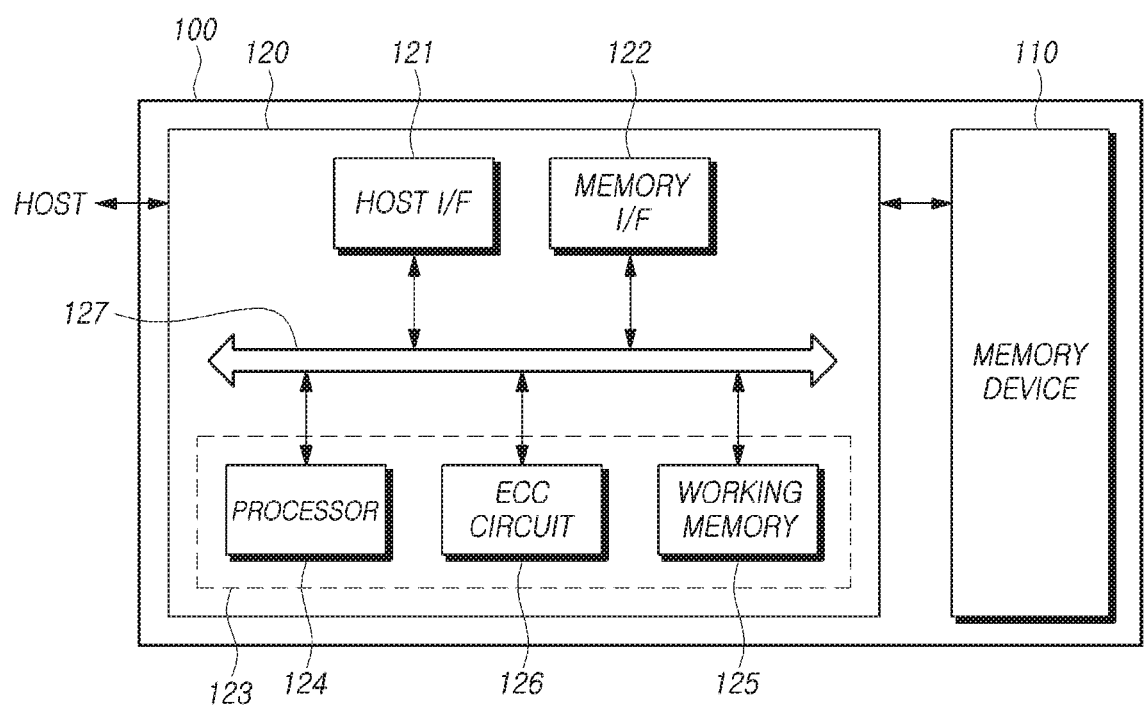
FIG. 1 is a block diagram schematically illustrating a memory system in accordance with an embodiment of the present invention.

FIG. 1 is a block diagram schematically illustrating a memory system 100 in accordance with an embodiment.

Referring to FIG. 1, the memory system 100 may include a memory device 110 which stores data, and a memory controller 120 which controls the memory device 110.

The memory device 110 includes a plurality of memory blocks and operates in response to the control of the memory controller 120. Operations of the memory device 110 may include, for example, a read operation, a program operation (also referred to as a write operation) and an erase operation.

The memory device 110 may include a memory cell array including a plurality of memory cells which store data. Such a memory cell array may exist in a memory block.

For example, the memory device 110 may be realized by a DDR SDRAM (double data rate synchronous dynamic random access memory), an LPDDR4 (low power double data rate 4) SDRAM, a GDDR (graphics double data rate) SDRAM, an LPDDR (low power DDR an RDRAM (Rambus dynamic random access memory), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM) or a spin transfer torque random access memory (STT-RAM).

The memory device 110 may be realized in a three-dimensional array structure. Embodiments may be applied to not only a flash memory device in which a charge storage layer is configured by a conductive floating gate but also a charge trap flash (CTF) in which a charge storage layer is configured by a dielectric layer.

The memory device 110 is configured to receive a command and an address from the memory controller 120, and access a region in the memory cell array which is selected by the address. In other words, the memory device 110 may perform an operation corresponding to the command, for a region selected by the address.

For example, the memory device 110 may perform a program operation, a read operation and an erase operation. In the program operation, the memory device 110 may program data in a region selected by the address. In the read operation, the memory device 110 may read data from a region selected by the address. In the erase operation, the memory device 110 may erase data stored in a region selected by the address.

The memory controller 120 may control the operation of the memory device 110 according to a request of a host or autonomously control the operation in the absence of a request of the host.

For example, the memory controller 120 may control write (program), read, erase and background operations for the memory device 110. For example, the background operation may be a garbage collection (GC) operation, a wear leveling (WL) operation, a bad block management (BBM) operation, or the like.

Referring to FIG. 1, the memory controller 120 may include a host interface 121, a memory interface 122, and a control circuit 123.

The host interface 121 provides an interface for communication with the host. When receiving a command from the host, the control circuit 123 may receive the command through the host interface 121, and then, may perform an operation of processing the received command.

The memory interface 122 is coupled with the memory device 110 and thereby provides an interface for communication with the memory device 110. That is, the memory interface 122 may be configured to provide communication between the memory device 110 and the memory controller 120 in response to the control of the control circuit 123.

The control circuit 123 performs the general control operations of the memory controller 120, thereby controlling the operations of the memory device 110. To this end, for instance, the control circuit 123 may include at least one of a processor 124 and a working memory 125, and may further include an error detection and correction circuit (ECC circuit) 126.

The processor 124 may control general operations of the memory controller 120, and may perform a logic calculation. The processor 124 may communicate with the host through the host interface 121, and may communicate with the memory device 110 through the memory interface 122.

The processor 124 may perform the function of a flash translation layer (FTL). The processor 124 may translate a logical block address (LBA) provided by the host, into a physical block address (PBA), through the flash translation layer (FTL). The flash translation layer (FTL) may receive the logical block address (LBA) and translate it into the physical block address (PBA), by using a mapping table. There are various address mapping methods of the flash translation layer, depending on a mapping unit. Representative address mapping methods include a page mapping method, a block mapping method, and a hybrid mapping method.

The processor 124 is configured to randomize data received from the host. For example, the processor 124 may randomize data received from the host, by using a randomizing seed. Randomized data as data to be stored is provided to the memory device 110 and is programmed to the memory cell array.

The processor 124 is configured to derandomize data received from the memory device 110, in a read operation. For example, the processor 124 may derandomize data received from the memory device 110, by using a derandomizing seed. Derandomized data may be outputted to the host.

The processor 124 may control the operation of the memory controller 120 by executing firmware. In other words, in order to control general operations of the memory controller 120 and perform a logic calculation, the processor 124 may execute (drive) firmware loaded to the working memory 125 upon booting. For instance, the firmware may be stored in the memory device 110 and be loaded to the working memory 125.

The firmware as a program executed in the memory system 100 may include, for example, a flash translation layer (FTL) which performs a translation function between a logical address requested to the memory system 100 from the host and a physical address of the memory device 110, a host interface layer (HIL) which serves to analyze a command requested to the memory system 100 as a storage device from the host and transfer the command to the flash translation layer (FTL), and a flash interface layer (FIL) which transfers a command instructed from the flash translation layer (FTL) to the memory device 110.

The working memory 125 may store firmware, program code, a command and data which are necessary to drive the memory controller 120.

The working memory 125, implemented as a volatile memory for example, may include at least one of an SRAM (static RAM), a DRAM (dynamic RAM) and an SDRAM (synchronous DRAM).

The ECC circuit 126 may be configured to detect an error bit of data stored in the working memory 125 (that is, read data transferred from the memory device 110) by using an error correction code and correct the detected error bit.

The ECC circuit 126 may be configured to decode data by using an error correction code. The ECC circuit 126 may be realized by any of various decoders depending on the code used. For example, a decoder which performs unsystematic code decoding or a decoder which performs systematic code decoding may be used.

For example, the ECC circuit 126 may detect an error bit by the unit of sector for each read data. Namely, each read data may be constituted by a plurality of sectors. A sector may mean a data unit smaller than a page as a read unit of a flash memory. Sectors constituting each read data may be matched with one another by the medium of an address.

The ECC circuit 126 may calculate a bit error rate (BER), and may determine whether an error is correctable or not, by the unit of sector. For example, in the case where a bit error rate (BER) is higher than a reference value, the ECC circuit 126 may determine that a corresponding sector is uncorrectable or has failed. On the other hand, in the case where a bit error rate (BER) is lower than the reference value, the ECC circuit 126 may determine that a corresponding sector is correctable or has passed.

The ECC circuit 126 may perform an error detection and correction operation sequentially for all read data. In the case where a sector included in read data is correctable, the ECC circuit 126 may omit an error detection and correction operation for a corresponding sector for next read data. If the error detection and correction operation for all read data is ended in this way, the ECC circuit 126 may detect a sector, which is determined to be uncorrectable. There may be one or more sectors that are determined to be uncorrectable. The ECC circuit 126 may transfer information (for example, address information) on a sector which is determined to be uncorrectable, to the processor 124.

A bus 127 may be configured to provide channels among the components 121, 122, 124, 125 and 126 of the memory controller 120. The bus 127 may include, for example, a control bus for transferring various control signals, commands and the likes, a data bus for transferring various data, and the like.

The above-described components 121, 122, 124, 125 and 126 of the memory controller 120 are depicted by way of example only. Depending on application, one or more of components 121, 122, 124, 125 and 126 may be deleted, and in some cases one or more of components 121, 122, 124, 125 and 126 may be combined. Also, the memory controller 120 may include one or more additional components not shown in FIG. 1.

The memory device 110 is described in detail below with reference to FIG. 2.

Figure 2:
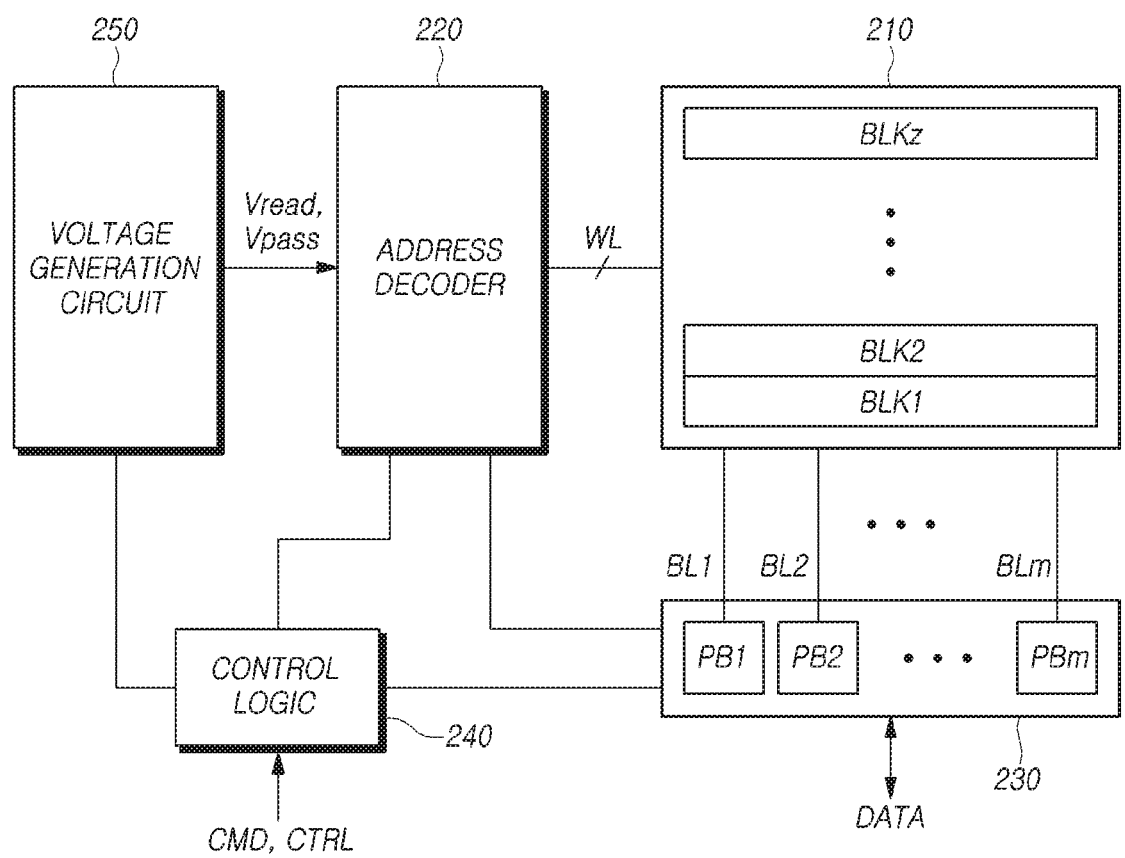
FIG. 2 is a block diagram schematically illustrating a memory device in accordance with an embodiment of the present invention.

FIG. 2 is a block diagram schematically illustrating the memory device 110 in accordance with an embodiment.

Referring to FIG. 2, the memory device 110 may include a memory cell array 210, an address decoder 220, a read and write circuit 230, control logic 240, and a voltage generation circuit 250.

The memory cell array 210 may include a plurality of memory blocks BLK1 to BLKz (z is a natural number of 2 or greater).

The plurality of memory blocks BLK1 to BLKz may be coupled to the address decoder 220 through word lines WL. The plurality of memory blocks BLK1 to BLKz may be coupled to the read and write circuit 230 through bit lines BL1 to BLm.

Each of the plurality of memory blocks BLK1 to BLKz may include a plurality of memory cells. For example, the plurality of memory cells may be nonvolatile memory cells, and may be configured by nonvolatile memory cells which have vertical channel structures. The memory cell array 210 may be configured by a memory cell array of a two-dimensional structure, or by a memory cell array of a three-dimensional structure.

Each of the plurality of memory cells included in the memory cell array may store at least 1-bit data. For instance, each of the plurality of memory cells included in the memory cell array 210 may be a signal level cell (SLC) which stores 1-bit data. For another instance, each of the plurality of memory cells included in the memory cell array 210 may be a multi-level cell (MLC) which stores 2-bit data. For another instance, each of the plurality of memory cells included in the memory cell array 210 may be a triple level cell (TLC) which stores 3-bit data. For another instance, each of the plurality of memory cells included in the memory cell array 210 may be a quad level cell (QLC) which stores 4-bit data. For still another instance, the memory cell array 210 may include a plurality of memory cells each of which stores 5 or more-bit data.

Referring to FIG. 2, the address decoder 220, the read and writhe circuit 230, the control logic 240 and the voltage generation circuit 250 may operate as a peripheral circuit which drives the memory cell array 210.

The address decoder 220 may be coupled to the memory cell array 210 through the word lines WL. The address decoder 220 may be configured to operate in response to the control of the control logic 240. The address decoder 220 may receive an address through an input/output buffer in the memory device 110.

The address decoder 220 may be configured to decode a block address in the received address. The address decoder 220 may select at least one memory block depending on the decoded block address. The address decoder 220 may apply a read voltage Vread generated in the voltage generation circuit 250 to a word line selected in a memory block selected in a read voltage applying operation during a read operation, and may apply a pass voltage Vpass to the remaining unselected word lines. Further, the address decoder 220 may apply a verify voltage generated in the voltage generation circuit 250 to a word line selected in a selected memory block in a program verify operation, and may apply the pass voltage Vpass to the remaining unselected word lines.

The address decoder 220 may be configured to decode a column address in the received address. The address decoder 220 may transmit the decoded column address to the read and write circuit 230.

A read operation and a program operation of the memory device 110 may be performed by the unit of page. An address received when a read operation or a program operation is requested may include a block address, a row address and a column address.

The address decoder 220 may selected one memory block and one word line depending on a block address and a row address. A column address may be decoded by the address decoder 220 and be provided to the read and write circuit 230.

The address decoder 220 may include at least one of a block decoder, a row decoder, a column decoder and an address buffer.

The read and write circuit 230 may include a plurality of page buffers PB1 to PBm. The read and write circuit 230 may operate as a read circuit in a read operation of the memory cell array 210, and may operate as a write circuit in a write operation of the memory cell array 210.

The read and write circuit 230 described above may include a page buffer circuit or a data register circuit. For example, the data register circuit may include a data buffer for performing a data processing function, and may further include a cache buffer for performing a caching function.

The plurality of page buffers PB1 to PBm may be coupled to the memory cell array 210 through the bit lines BL1 to BLm. The plurality of page buffers PB1 to PBm may continuously supply sensing current to bit lines coupled with memory cells to sense threshold voltages of the memory cells in a read operation and a program verify operation, and may latch sensing data by sensing, through sensing nodes, that the amounts of current flowing depending on the programmed states of the corresponding memory cells, are changed. The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory device 110. As an exemplary embodiment, the read and write circuit 230 may include a column select circuit in addition to the page buffers (or page registers).

The control logic 240 may be coupled with the address decoder 220, the read and write circuit 230 and the voltage generation circuit 250. The control logic 240 may receive a command CMD and a control signal CTRL through the input/output buffer of the memory device 110.

The control logic 240 may be configured to control general operations of the memory device 110 in response to the control signal CTRL. Further, the control logic 240 may output a control signal for adjusting the precharge potential levels of the sensing nodes of the plurality of page buffers PB1 to PBm.

The control logic 240 may control the read and write circuit 230 to perform a read operation of the memory cell array 210.

The voltage generation circuit 250 may generate the read voltage Vread and the pass voltage Vpass in a read operation in response to a voltage generation circuit control signal outputted from the control logic 240.

Figure 3:
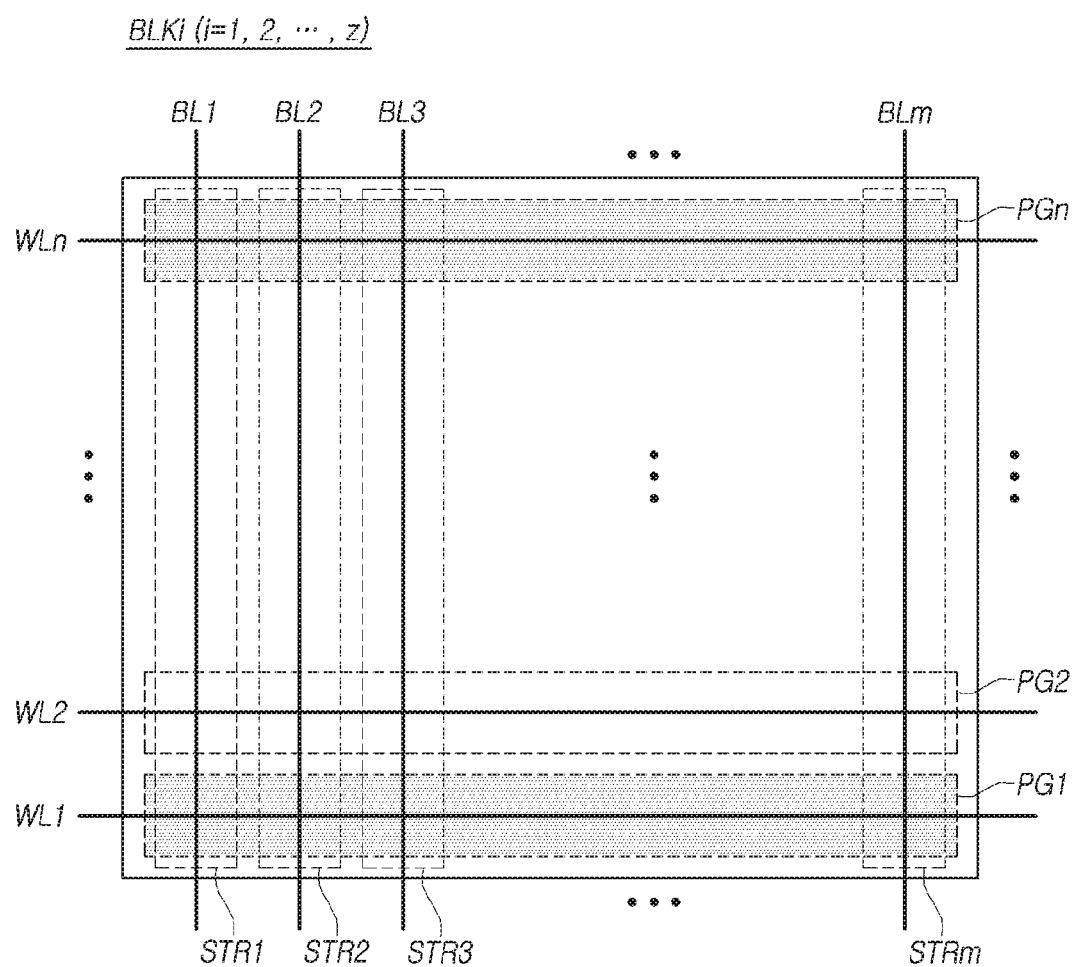
FIG. 3 is a diagram schematically illustrating a memory block of a memory device in accordance with an embodiment of the present invention.

FIG. 3 is a diagram schematically illustrating a memory block BLKi (i=1, 2, . . . or z) of the memory device 110 in accordance with an embodiment.

Referring to FIG. 3, any memory block BLKi (i=1, 2, . . . or z) among the plurality of memory blocks BLK1 to BLKz included in the memory device 110 may be configured as n pages, i.e., PG1 to PGn (n is a natural number of 2 or greater), and m strings, i.e., STR1 to STRm (m is a natural number of 2 or greater) are disposed in the form of a matrix.

The n pages PG1 to PGn correspond to the n word lines WL1 to WLn, and the m strings STR1 to STRm correspond to the m bit lines BL1 to BLm.

In other words, in the any memory block BLKi (i=1, 2, . . . or z) among the plurality of memory blocks BLK1 to BLKz, the n word lines WL1 to WLn and the m bit lines BL1 to BLm may be disposed in an intersecting pattern.

Memory cells may be defined at the respective intersections of the n word lines WL1 to WLn and the m bit lines BL1 to BLm, and a transistor may be disposed in each memory cell. For example, the transistor disposed in each memory cell may include a drain, a source and a gate. The drain (or the source) of the transistor may be coupled directly or via one or more other transistors with a corresponding bit line, the source (or the drain) of the transistor may be coupled directly or via one or more other transistors with a source line (which may be the ground), and the gate of the transistor may include a floating gate which is surrounded by a dielectric and a control gate to which a gate voltage is applied.

A read operation and a program operation (write operation) may be performed by the unit of page, and an erase operation may be performed by the unit of memory block.

Referring to FIG. 3, in any memory block BLKi (i=1, 2, . . . or z) among the plurality of memory blocks BLK1 to BLKz, a source select line and a drain select line may be provided, one outside of and adjacent to one outermost word line, i.e., word line WL1 in FIG. 3 and the other outside of and adjacent to the other outermost word line, i.e., word line WLn in FIG. 3.

Also, at least one dummy word line may be additionally disposed between word line WL1 and the first select line. At least one dummy word line may also be additionally disposed between word line WLn and the second select line.

Figure 4:
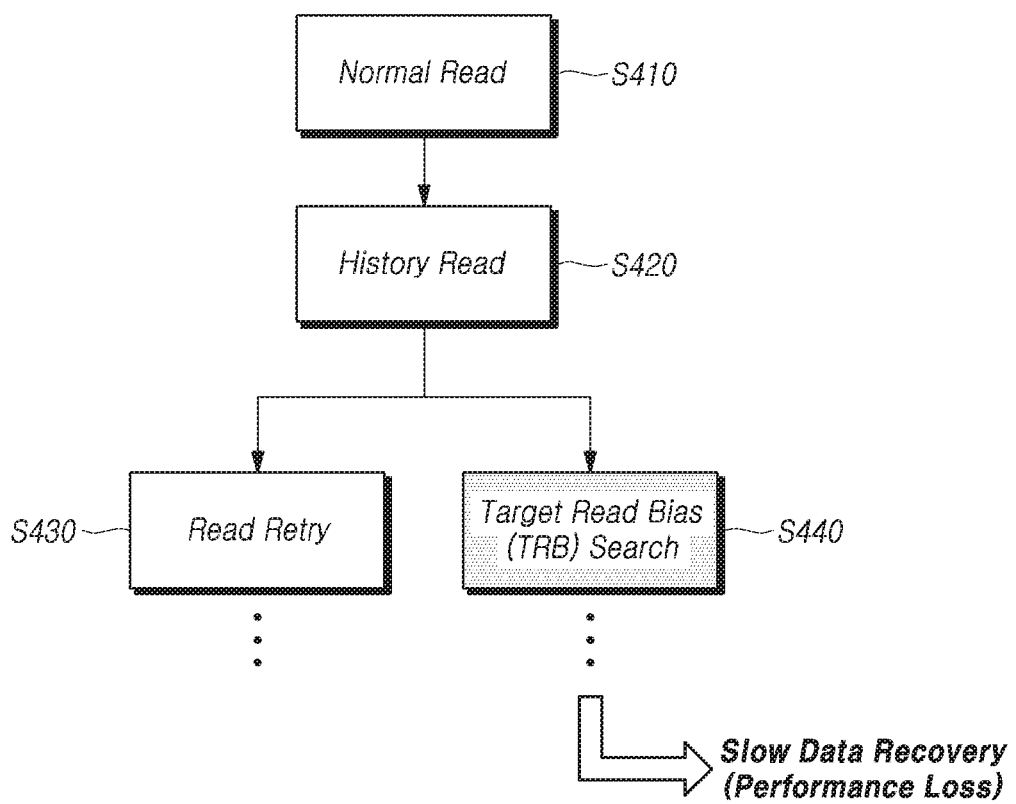
FIG. 4 is a flow chart illustrating a data recovery process in a memory system in accordance with an embodiment of the present invention.

FIG. 4 is a flow chart illustrating a data recovery process in the memory system 100 in accordance with an embodiment.

Referring to FIG. 4, the memory system 100 may perform a data recovery process when a read fail occurs during data read step S410.

Referring to FIG. 4, the data recovery process performed due to a read fail may include a history read step S420, a read retry step S430 of performing a read retry operation when a history exists as determined at the history read step S420, and a target read bias search step S440 of searching for a target read bias (TRB) when a history does not exist as determined at the history read step S420.

In the history read step S420, the memory controller 120 may check whether a target read bias (TRB) which has been searched for, or information corresponding thereto (e.g., an index of a read retry table), exists as a history.

In the present specification, a target read bias (TRB) may be a type of gate voltage which is applied to a word line WL electrically coupled to a transistor disposed in each memory cell, to perform a read operation. Such a target read bias (TRB) is also referred to as an optimal read bias. For example, such a target read bias may correspond to each word line WL or may correspond to each memory block. Namely, a history including a target read bias (TRB) or information corresponding thereto may be a type of information or data for each word line WL or may exist for each memory block.

The read retry step S430 is performed when it is determined at the history read step S420 that a history exists. In such read retry step S430, the memory controller 120 may perform a read retry operation by using a target read bias (TRB) included in the history checked at the history read step S420.

The target read bias search step S440 is performed when it is determined at the history read step S420 that a history does not exist. At the target read bias search step S440, the memory controller 120 newly searches for a target read bias (TRB) corresponding to an optimal read bias, and generates a history including the newly searched target read bias (TRB). Thereafter, the memory controller 120 may perform the read retry step S430 by using the target read bias (TRB) found in the search. The target read bias (TRB) corresponds to a corresponding word line WL or a corresponding memory block.

Here, searching for a target read bias (TRB) may mean finding an optimal read bias for accurately reading data stored in a corresponding memory cell without a read fail. A number of optimal read biases as targets of the search process may vary depending on levels (e.g., a single level, a multiple-level, a triple-level and so forth) of a corresponding memory cell.

As described above, a target read bias (TRB) is also referred to as an optimal read bias. A read bias (which may also be referred to as a read voltage) may not be fixed but vary depending on a threshold distribution of memory cells within the memory device 110. Thus, an optimal read bias appropriate for a distorted threshold voltage distribution of memory cells within the memory device 110 is referred to as a target read bias (TRB). Here, distortion of the threshold voltage distribution may be caused by unintended change of threshold voltages of memory cells. That is, when the distortion of threshold voltage distribution occurs, the threshold voltage (Vth) of the transistor may unintendedly decrease or increase. Meanwhile, when observing an entire memory cell array, the threshold voltage distribution of a plurality of transistors disposed in the memory cell array may shift in a direction in which the threshold voltages decrease or a direction in which the threshold voltages increase. The degree of distortion of threshold voltage distribution may increase when adjacent threshold voltage distributions drastically overlap. Such distortion of the threshold voltage distribution may cause read fail.

According to the above descriptions, a target read bias (TRB) needs to be determined as an optimal value depending on the distortion degree of the threshold voltage distribution. A number of optimal read biases as targets of the search may vary depending on whether a memory cell is a single level cell (SLC), a multi-level cell (MLC), a triple level cell (TLC) or a quad level cell (QLC). Single level cells (SLC) have a total of two threshold voltage distributions (L0 and L1) per cell, multi-level cells (MLC) have a total of four threshold voltage distributions (L0, L1, L2 and L3) per cell, and triple level cells (TLC) have a total of eight threshold voltage distributions (L0, L1, L2, L3, L4, L5, L6 and L7) per cell. Quad level cells (QLC) have a total of 16 threshold voltage distributions per cell.

For instance, in the case of single level cells (SLC) having two ($=2^1$) threshold voltage distributions, in the worst case, a single target read bias (TRB) may be searched for. For another instance, in the case of multi-level cells (MLC) having four ($=2^2$) threshold voltage distributions, in the worst case, three target read biases may be searched for. For still another instance, in the case of triple level cells (TLC) having eight ($=2^2$) threshold voltage distributions, in the worst case, seven target read biases may be searched for. Due to this fact, in a data recovery process, too long of a time may be required to search for those target read biases.

In this way, when recovering data, in the case where a history does not exist, optimal read biases are searched for and thus a lot of time is spent searching for target read biases. As a result, data recovery may be slow. Accordingly, deterioration in the performance of the memory system 100 may be caused.

To address this situation, embodiments of the present invention provide a preemptive history generation technique for high speed data recovery. Such preemptive history generation technique for high speed data recovery is described below in detail.

Figure 5:
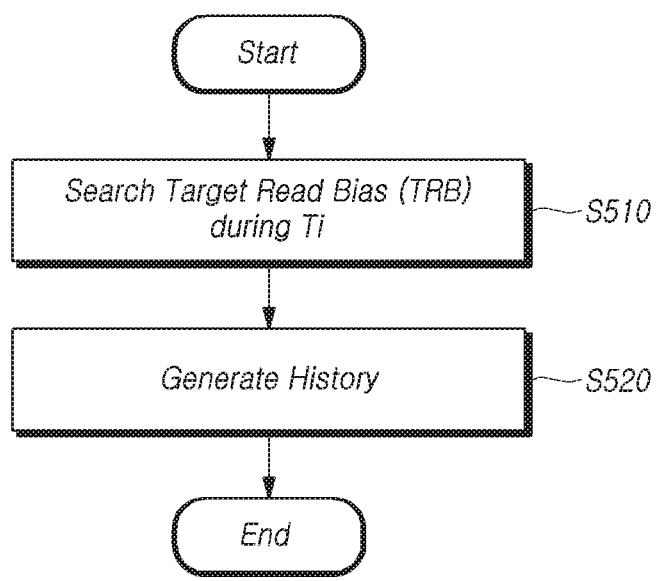
FIG. 5 is a flow chart illustrating a method for operating a memory controller using a preemptive history generation technique for high speed data recovery in a memory system in accordance with an embodiment of the present invention.
Figure 6:
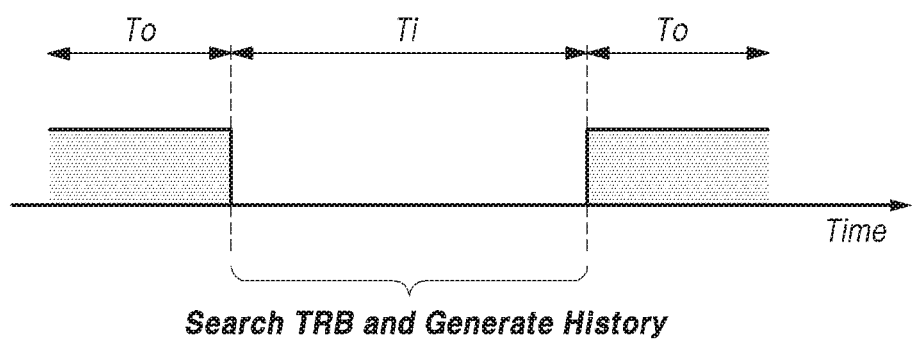
FIG. 6 is a diagram illustrating preemptive history generation timing for high speed data recovery in a memory system in accordance with an embodiment of the present invention.
Figure 7:
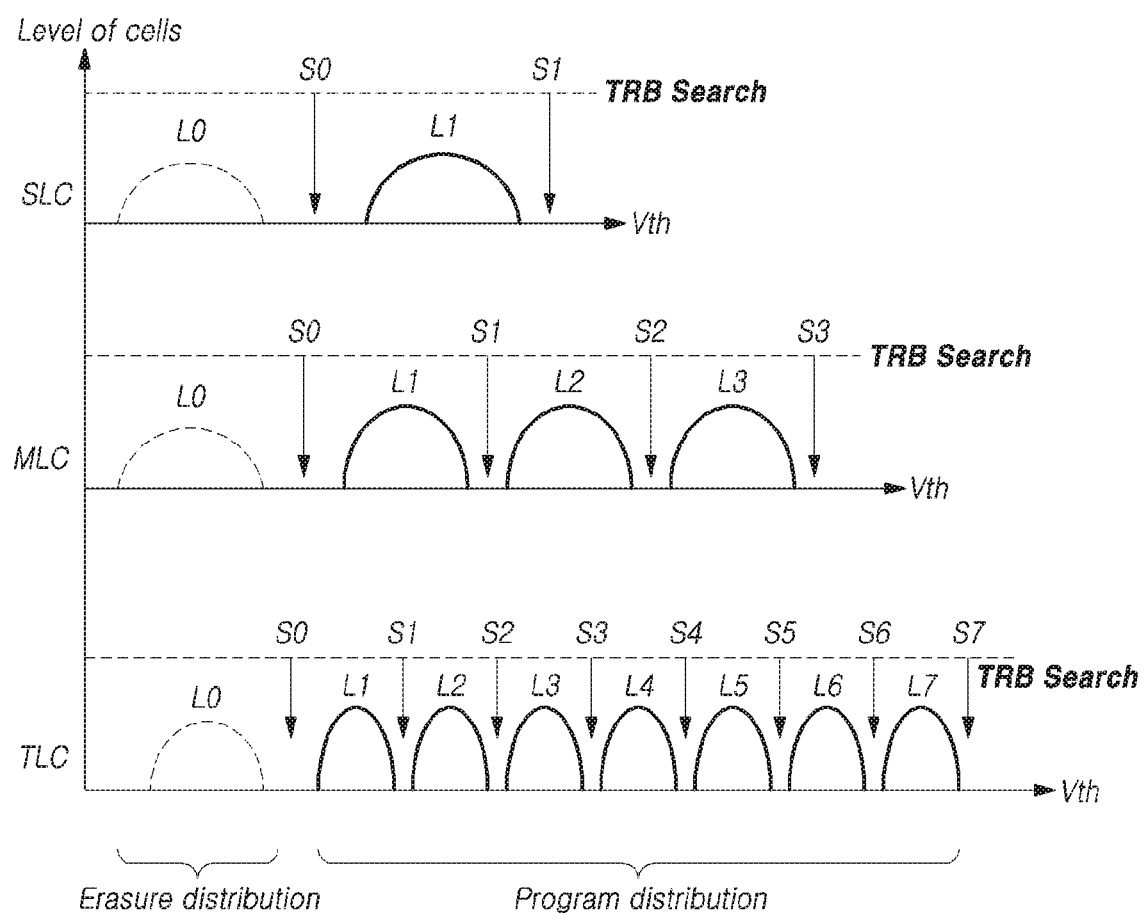
FIG. 7 is a diagram illustrating a preemptive target read bias search for high speed data recovery in a memory system in accordance with an embodiment of the present invention.

FIG. 5 is a flow chart illustrating a method for operating the memory controller 120 using a preemptive history generation technique for high speed data recovery in the memory system 100 in accordance with an embodiment, FIG. 6 is a diagram illustrating a preemptive history generation timing for high speed data recovery in the memory system 100 in accordance with an embodiment, and FIG. 7 is a diagram illustrating a preemptive target read bias search for high speed data recovery in the memory system 100 in accordance with an embodiment.

Referring to FIGS. 5 and 6, the preemptive history generation technique for high speed data recovery may be performed through step S510 of searching for a target read bias (TRB) during an idle time Ti, and step S520 of generating a history including the target read bias (TRB) found in the search.

During the idle time Ti, a normal operation such as a read operation, a program operation and an erase operation is not performed. The idle time Ti may be between successive operation times To, during each of which a normal operation is performed.

Such an idle time Ti may be of the flash interface layer (FIL) in the memory controller 120. For instance, the flash interface layer (FIL) may transfer a command instructed from the flash translation layer (FTL) to the memory device 110.

The memory controller 120 may search for a target read bias (TRB) for a first word line (one of WL1 to WLn) in a first memory block (i.e., any one of BLK1 to BLKz) in the memory device 110 during the idle time Ti (S510), and may generate a history including the searched target read bias (TRB) (S520). The first word line is a target for searching for a target read bias (TRB).

At the step S510, searching for a target read bias (TRB) may mean finding an optimal read bias for accurately reading data stored in a corresponding memory cell without a read fail. The number of optimal read biases as the targets of the search process may vary depending on levels (e.g., a single level, a multiple-level, a triple-level and so forth) of the corresponding memory cell.

For example, while supplying various read biases to the first word line (one of WL1 to WLn), an optimal read bias may be selected as the target read bias (TRB) from the supplied read biases. The target read bias (TRB) selected in this way is an optimal read bias capable of accurately reading data stored in a page corresponding to the first word line (one of WL1 to WLn) without a read fail.

For instance, the target read bias search and history generation steps S510 and S520 during the idle time Ti may be performed by the control circuit 123 included in the memory controller 120. That is, the processor 124 in the control circuit 123 may perform the target read bias search and history generation steps S510 and S520 by executing firmware loaded in the working memory 125.

A history may be generated by the memory controller 120, and may be stored in an internal memory (e.g., the working memory 125 or the like) of the memory controller 120. A history may be stored in the memory device 110 or may be stored in both an internal memory (e.g., the working memory 125 or the like) of the memory controller 120 and the memory device 110.

The memory controller 120 may perform the steps of the target read bias search and history generation by the unit of a memory block or by the unit of a word line.

Thus, a target read bias (TRB) for one first word line in the first memory block may be one representative target read bias for the first memory block including the first word line, or may be an individual target read bias for the one first word line in the first memory block.

In other words, the memory controller 120 may search for a target read bias (TRB) for a first word line among the plurality of word lines WL1 to WLn in the first memory block, as a representative target read bias for the first memory block.

Alternatively, the memory controller 120 may search for a target read bias (TRB) for a first word line among the plurality of word lines WL1 to WLn in the first memory block, as an individual target read bias for the first word line. Namely, the memory controller 120 may individually search for a target read bias for each of the plurality of word lines WL1 to WLn in the first memory block.

Alternatively, the memory controller 120 may search for a target read bias (TRB) for a first word line among the plurality of word lines WL1 to WLn in the first memory block, as a representative target read bias for a word line group including the first word line. Here, one word line group may include at least two word lines among the plurality of word lines WL1 to WLn in the first memory block.

As described above, a target read bias (TRB) may be determined via a search depending on the degree of distortion of the threshold voltage (Vth) distribution of the memory device 110. Therefore, searching for and determining a target read bias (TRB) may be performed in consideration of the threshold voltage distribution(s) of the memory device 110 as illustrated in FIG. 7.

Referring to FIG. 7, during the idle time Ti, a number of optimal read biases required to be searched for may vary depending on whether a memory cell is a single level cell (SLC), a multi-level cell (MLC), a triple level cell (TLC) or a quad level cell (QLC).

For instance, referring to FIG. 7, in the case of single level cells (SLC) having two ($=2^1$) threshold voltage distributions L0 and L1, a single target read bias (e.g., at least S0 of S0 and S1) may be searched for through at least one search process. For another instance, in the case of multi-level cells (MLC) having four ($=2^2$) threshold voltage distributions L0, L1, L2 and L3, a three target read biases (e.g., at least S0 to S2 of S0 to S3) may be searched for through at least three search processes. For still another instance, in the case of triple level cells (TLC) having eight ($=2^3$) threshold voltage distributions L0, L1, L2, L3, L4, L5, L6 and L7, seven target read biases (e.g., at least S0 to S6 of S0 to S7) may be searched for through at least seven search processes.

Figure 8:
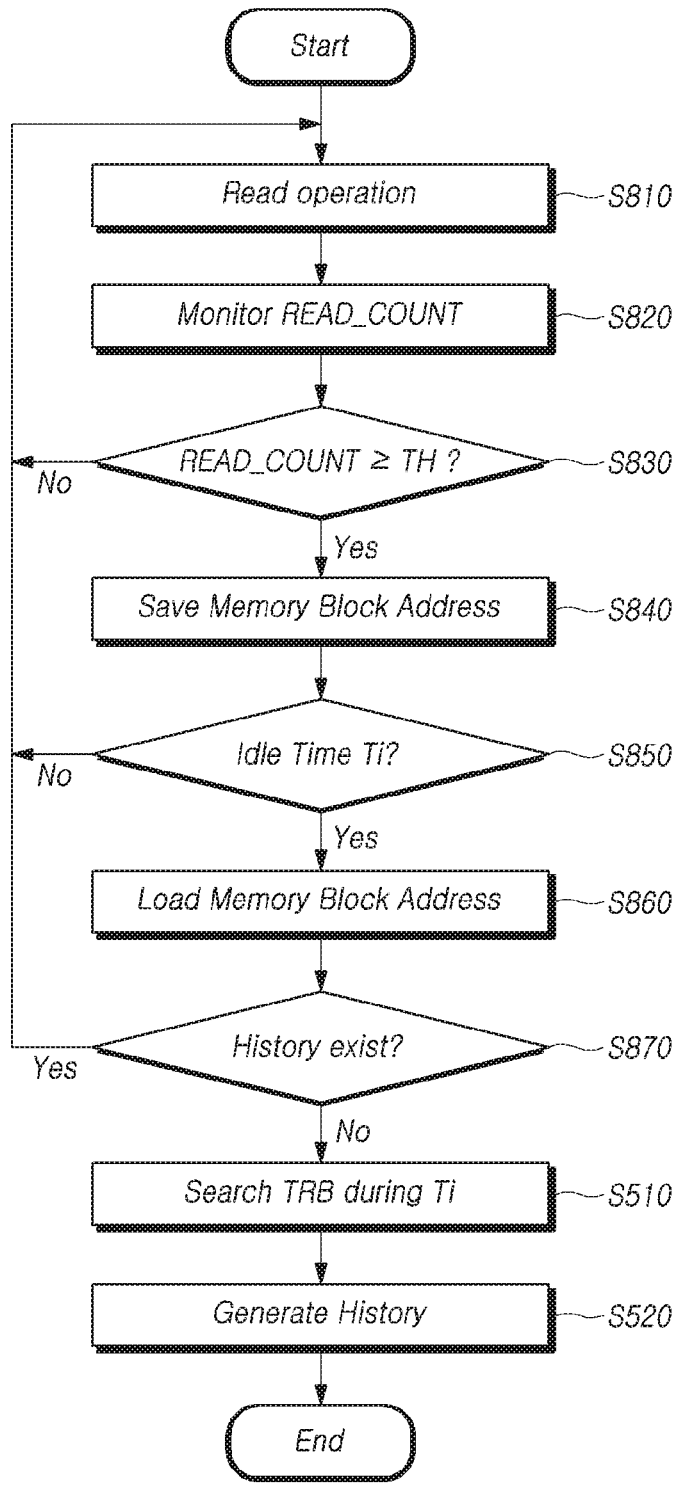
FIG. 8 is a flow chart illustrating in detail a method for operating a memory controller using a preemptive history generation technique for high speed data recovery in a memory system in accordance with an embodiment of the present invention.

FIG. 8 is a flow chart illustrating in detail a method for operating the memory controller 120 using a preemptive history generation technique for high speed data recovery in the memory system 100 in accordance with an embodiment.

Referring to FIG. 8, the method for operating the memory controller 120 using a preemptive history generation technique for high speed data recovery in the memory system 100 may include read operation step S810, read count value monitoring step S820, memory state determination step S830, memory block address saving step S840, idle time determination step S850, memory block address loading step S860, and history existence checking step S870. Steps S810 to S870 may be performed before step S510 of searching for a target read bias is performed.

In the case where a read operation has been performed for a first memory block among the plurality of memory blocks BLK1 to BLKz at the read operation step S810, at the read count value monitoring step S820, the memory controller 120 increases a read count value READ_COUNT for the first memory block, and monitors the increased read count value READ_COUNT.

At the memory state determination step S830, the memory controller 120 determines whether the read count value READ_COUNT for the first memory block according to the read operation for one page (one of PG1 to PGn) in the first memory block is equal to or greater than a set threshold value TH.

If the read count value READ_COUNT for the first memory block is less than the set threshold value TH, as determined at step S830, the memory controller 120 may perform a read operation again.

If the read count value READ_COUNT for the first memory block is equal to or greater than the set threshold value TH, as determined at step S830, the memory block address saving step S840 is performed.

The threshold value TH may be set to be smaller than a degradation-related read count value corresponding to the first memory block. The degradation-related read count value corresponding to the first memory block is a value used to determine degradation of the first memory block, and may be a specified value (i.e. 100).

In connection with this example, if the read count value READ_COUNT of the first memory block reaches the degradation-related read count value, that means that degradation has occurred in the first memory block, and a bad block management (BBM) operation such as a garbage collection operation may be performed for the first memory block. Taking this into consideration, the threshold value TH corresponding to the read count value READ_COUNT for the preemptive history generation technique may be set to be smaller than the degradation-related read count value for the bad block management operation such as the garbage collection operation.

If a condition for triggering performance of the preemptive history generation technique is satisfied, the memory block address saving step S840 is performed. At such memory block address saving step S840, the memory controller 120 saves a memory block address for the first memory block.

After the memory block address saving step S840, the idle time determination step S850 is performed. At the idle time determination step S850, the memory controller 120 determines whether the system is idle, i.e., whether the system is in idle time Ti.

When it is determined at step S850 that it is an idle time Ti, the memory block address loading step S860 and the history existence checking step S870 are performed.

When it is an idle time Ti, at the memory block address loading step S860, the memory controller 120 loads the memory block address for the first memory block which is saved at the memory block address saving step S840.

Thereafter, at the history existence checking step S870, the memory controller 120 determines whether or not a history exists. The history includes the read biases for the first memory block corresponding to the loaded memory block address.

If a history exists, as determined at step S870, the memory controller 120 omits the step S510 of searching for a target read bias (TRB) and step S520 of generating a history.

As a result of performing the history existence checking step S870, if a history does not exist, the memory controller 120 performs the step S510 of searching for a target read bias (TRB) and the step S520 of generating a history.

As described above, a preemptive history generation operation of preemptively generating a history by searching for a target read bias (TRB) is selectively, i.e., not always performed, but the memory controller 120 generates a history by searching for a target read bias (TRB) for a first word line (one of WL1 to WLn) in the first memory block during the idle time Ti in the case where the read count value READ_COUNT for the first memory block depending on a read operation for one page in the first memory block is equal to or greater than the set threshold value TH. Therefore, it is possible to prevent unnecessary searching for a target read bias and checking whether a history exists or not. Accordingly, it is possible to prevent unnecessary performance degradation of the memory controller 120 and the memory system 100 including the same.

Moreover, as described above, because the memory controller 120 preemptively generates a history necessary in a data recovery process in advance during the idle time Ti between normal operation times To before the data recovery process is performed according to a read fail, high speed data recovery is possible even though a read fail occurs.

The sequence of the steps illustrated in the flow chart of FIG. 8 is an example only, and may be changed. In some instances, multiple steps may be combined. Also, one step may be omitted or replaced with another step.

Figure 9:
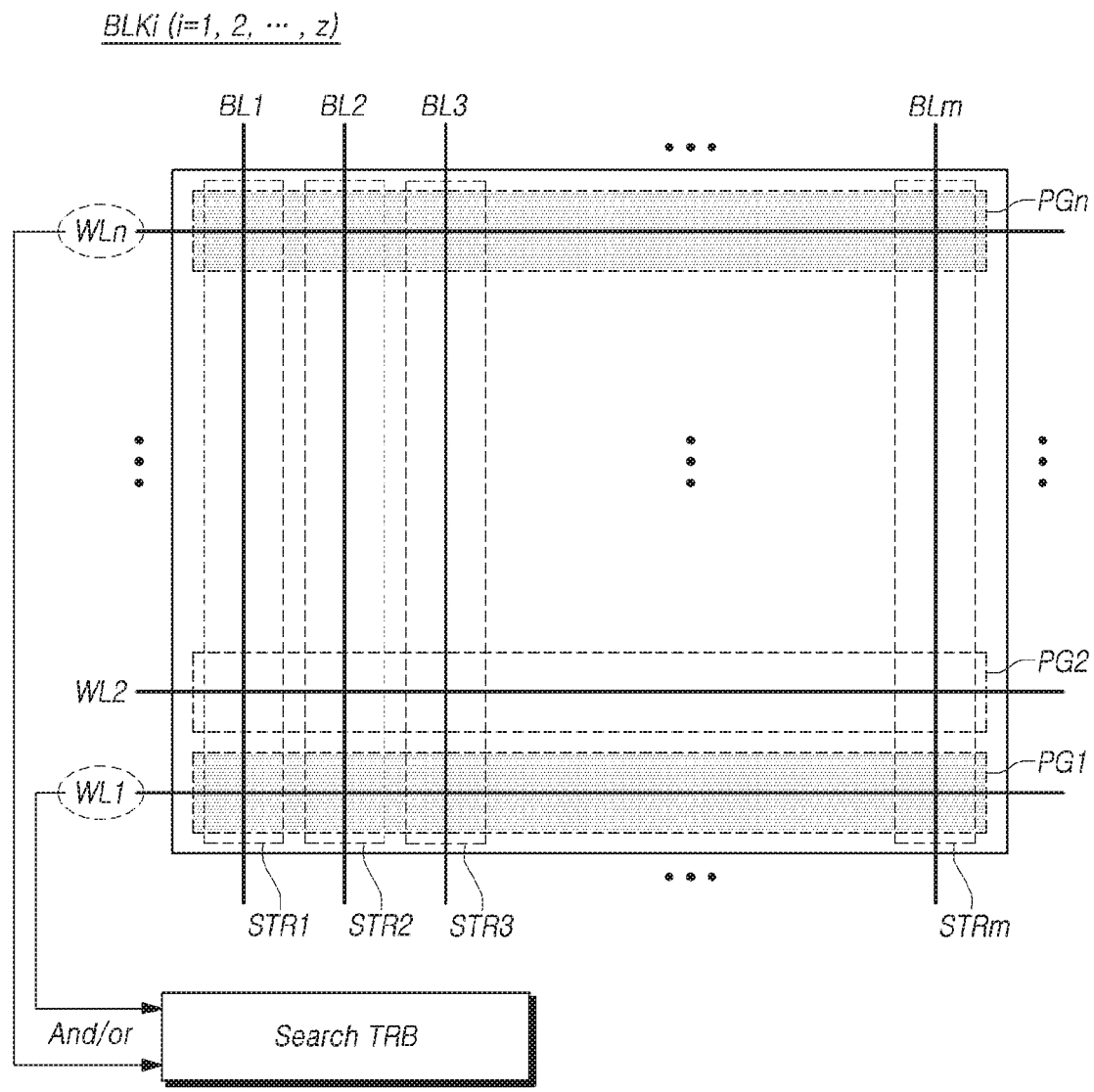
FIG. 9 is a diagram illustrating a preemptive target read bias search target for high speed data recovery in a memory system in accordance with an embodiment of the present invention.
Figure 10:
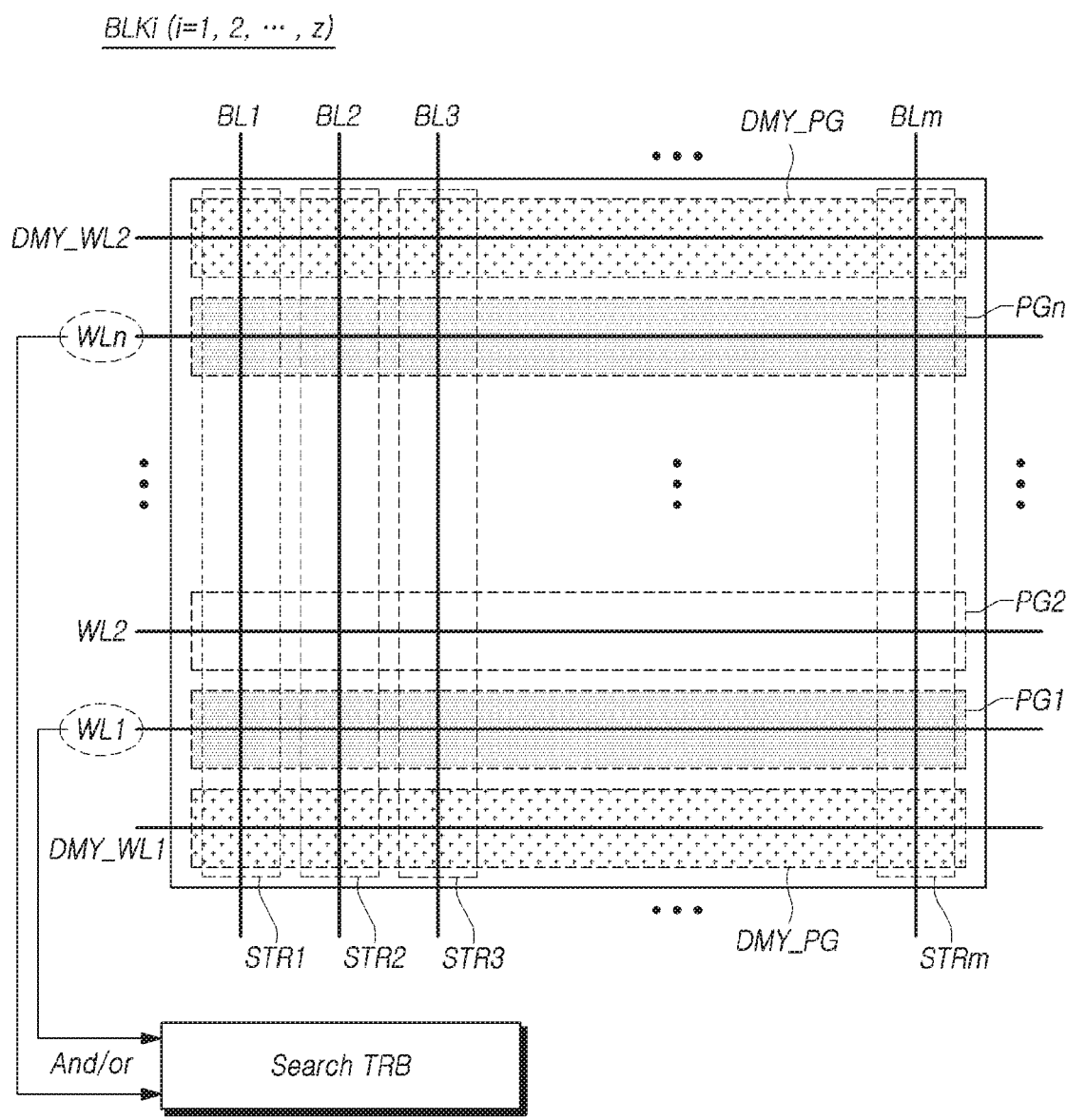
FIG. 10 is a diagram illustrating another preemptive target read bias search target for high speed data recovery in a memory system in accordance with an embodiment of the present invention.

FIG. 9 is a diagram illustrating a preemptive target read bias search target for high speed data recovery in the memory system 100 in accordance with an embodiment, and FIG. 10 is a diagram illustrating a preemptive target read bias search target for high speed is data recovery in the memory system 100 in accordance with an embodiment.

Referring to FIGS. 9 and 10, a target read bias (TRB) to be determined via a search during an idle time Ti may be a representative target read bias for the first memory block. Namely, the target read bias (TRB) may be one representative target read bias representing all of the word lines WL1 to WLn in the first memory block.

That is, only a part of the plurality of word lines WL1 to WLn included in the corresponding first memory block may be a target for which a target read bias (TRB) is to be preemptively searched for during the idle time Ti.

The two outermost word lines WL1 and WLn may be weakest word lines in terms of reliability among the plurality of word lines WL1 to WLn.

Taking this into consideration, at least one first word line as a target for which a target read bias (TRB) is to be preemptively searched for during the idle time Ti may correspond to, for example, at least one of the two outermost word lines WL1 and WLn among the plurality of word lines WL1 to WLn in the first memory block, as illustrated in FIG. 9.

As illustrated in FIG. 10, in any first memory block BLKi (i=1, 2, . . . or z) among the plurality of memory blocks BLK1 to BLKz, at least one first dummy word line DMY_WL1 may be additionally disposed outside a first outermost word line WL1 adjacent to the read and write circuit 230 between the two outermost word lines WL1 and WLn, and at least one second dummy word line DMY_WL2 may be additionally disposed outside a second outermost word line WLn positioned opposite to the first outermost word line WL1 between the two outermost word lines WL1 and WLn.

In the case of such a structure, the one or more word lines WL1 and WLn adjacent to the one or more dummy word lines DMY_WL1 and DMY_WL2 may be weakest word lines in terms of reliability among the plurality of word lines WL1 to WLn.

Thus, as illustrated in FIG. 10, a first word line as a target for which a target read bias (TRB) is to be preemptively searched for during the idle time Ti may correspond to the one or more word lines WL1 and WLn which are adjacent to the one or more dummy word lines DMY_WL1 and DMY_WL2 among the plurality of word lines WL1 to WLn in the first memory block.

The first word line is a weak or the weakest word line in terms of reliability among the plurality of word lines WL1 to WLn in the first memory block. In general, the outermost word lines or the word lines adjacent to the dummy word lines may be the weakest word lines in terms of reliability. In most cases, the outermost word lines and the word lines adjacent to the dummy word lines may be the same, that is, word lines WL1 and WLn. However, in some cases, other word lines may be the weakest, e.g., the two word lines adjacent to WL1 and WLn respectively, that is WL2 to WLn-1. The reliability of word line may be determined based on the number of fail data bits (correctable by ECC or uncorrectable) generated in data read from the word line. For one or more word lines to be weakest in terms of reliability may mean that a read fail is more likely to occur on such word line(s) as a result of the associated read operation not being performed properly. In other words, the first word line may be a word line among the plurality of word lines WL1 to WLn, and may correspond to a word line which is determined to be likely to cause a read fail in a read operation.

Figure 11:
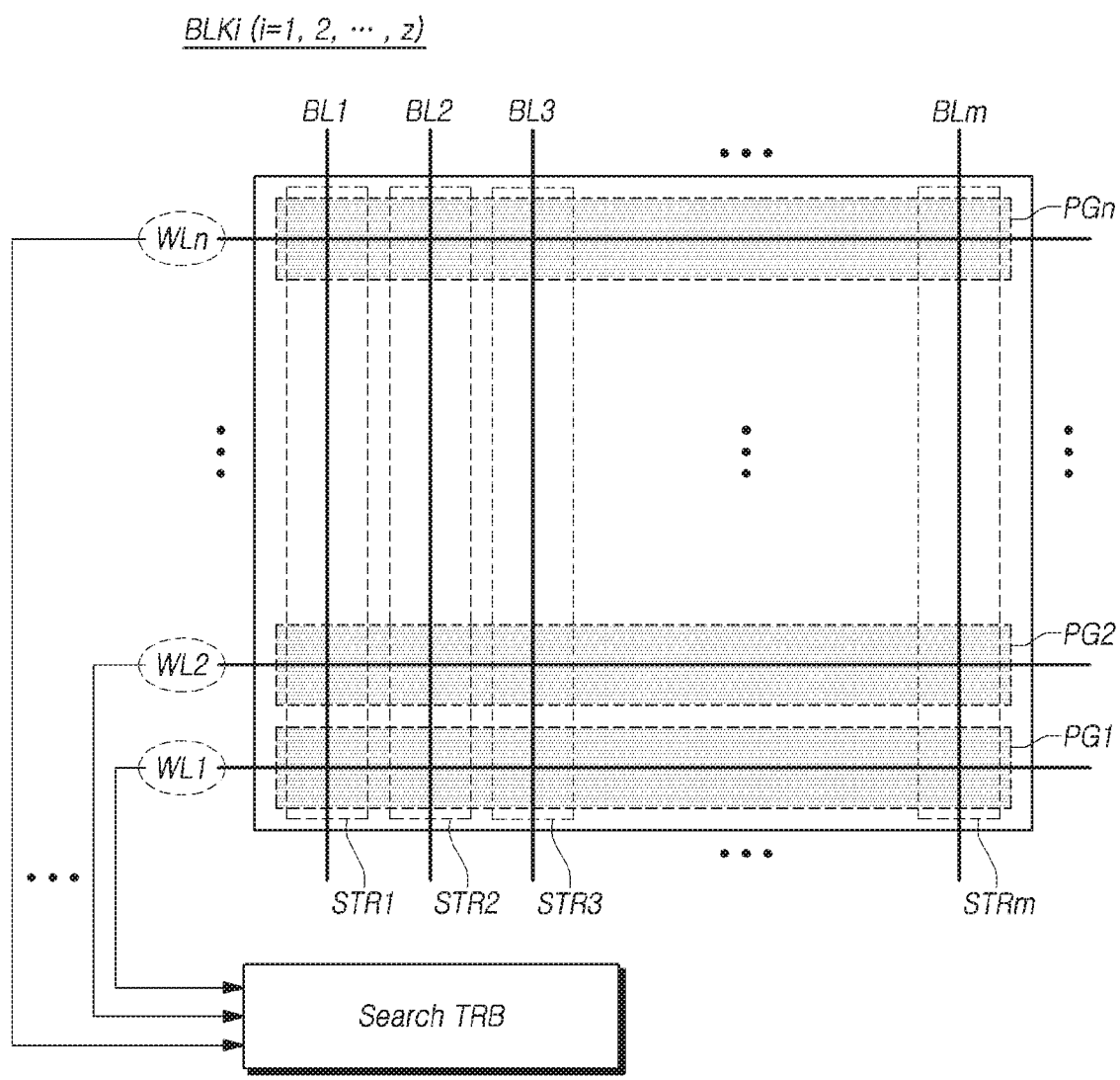
FIG. 11 is a diagram illustrating still another preemptive target read bias search target for high speed data recovery in a memory system in accordance with an embodiment of the present invention.

FIG. 11 is a diagram illustrating a preemptive target read bias search target for high speed data recovery in the memory system 100 in accordance with an embodiment.

Referring to FIG. 11, unlike that, as described above with reference to FIGS. 9 and 10, only a part of the plurality of word lines WL1 to WLn included in the corresponding first memory block becomes a target for which a target read bias is to be preemptively searched for during the idle time Ti, each of the plurality of word lines WL1 to WLn included in the corresponding first memory block may be a target for which a target read bias is to be preemptively searched for during the idle time Ti.

Therefore, referring to FIG. 11, the memory controller 120 may search for a target read bias for a first word line among the plurality of word lines WL1 to WLn in the corresponding first memory block, not as a representative target read bias representing the entire first memory block but as an individual target read bias for the corresponding first word line.

In other words, a target read bias which is searched for during the idle time Ti may be an individual target read bias for the first word line.

Figure 12:
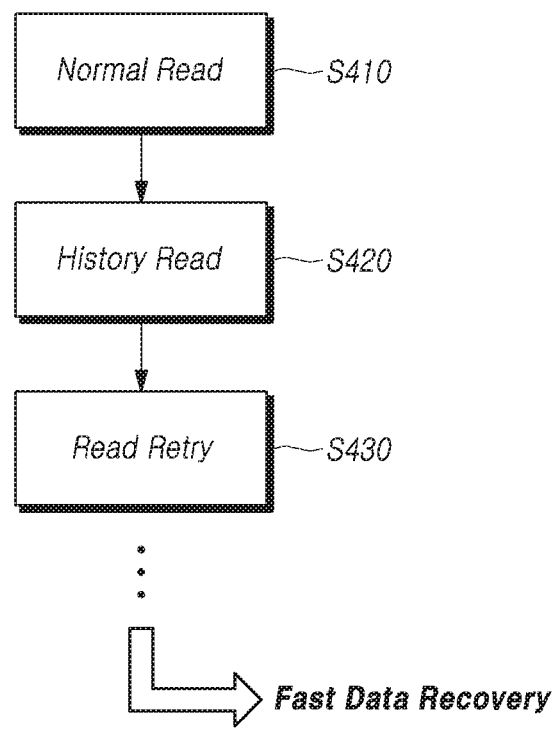
FIG. 12 is a flow chart illustrating a data recovery process in a memory system when a preemptive history generation technique is applied, in accordance with an embodiment of the present invention.

FIG. 12 is a flow chart illustrating a data recovery process in the memory system 100 in the case where the preemptive history generation technique is applied in accordance with an embodiment.

Referring to FIG. 12, according to the preemptive history generation technique described above, by preemptively searching for a target read bias (TRB) during the idle time Ti and preemptively generating a history in advance, when a read fail occurs as a result of performing a normal read operation (S410), the memory controller 120 may read the history preemptively generated before the read fail, in the process of performing the history read step S420, and thereby, may quickly perform a read retry (S430). Thus, high speed data recovery may be possible.

Namely, according to the preemptive history generation technique, when a history does not exist or is minimal, the target read bias search step S440 in the data recovery process may be skipped or minimally performed, whereby high speed data recovery may be possible.

For example, referring to FIG. 12, after the history generation step S520 of FIG. 8, when a data recovery process is performed upon occurrence of a read fail for one page in the first memory block, a read retry operation may be performed using a target read bias (TRB) by referring to the history preemptively generated in advance at the history generation step S520.

That is, after a history for the first memory block or a history for a first word line included in the first memory block is generated, when a read fail for one page in the first memory block occurs, the control circuit 123 in the memory controller 120 may perform a read retry operation based on a corresponding target read bias (TRB) by referring to the history generated in advance.

Figure 13:
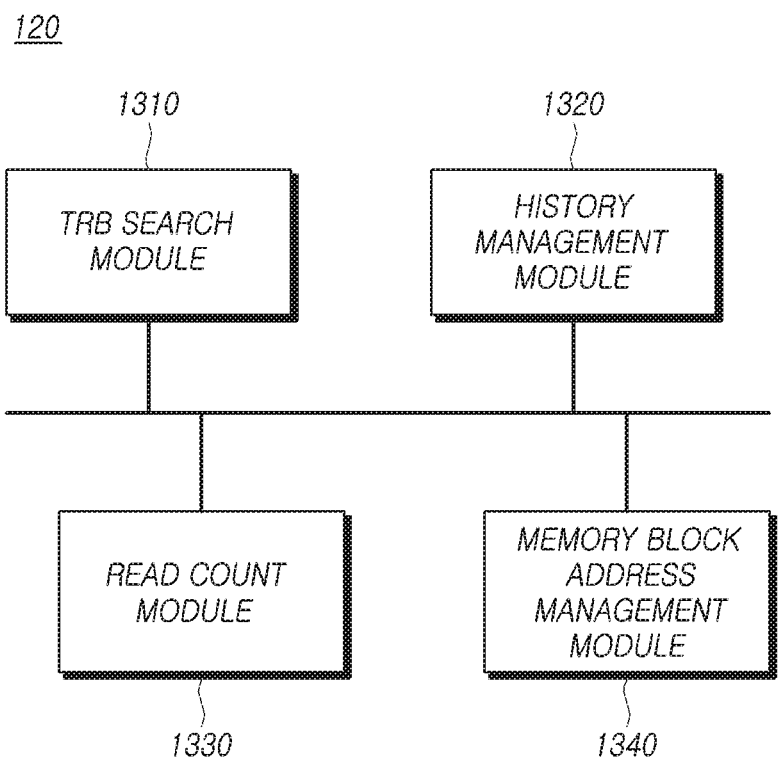
FIG. 13 is a schematic functional block diagram of a memory controller in accordance with an embodiment of the present invention.

FIG. 13 is a schematic functional block diagram of the memory controller 120 in accordance with an embodiment.

Referring to FIG. 13, the memory controller 120 may include a target read bias search module 1310 which preemptively searches for a target read bias for a first word line (any one of WL1 to WLn) among the plurality of word lines WL1 to WLn in the first memory block of the memory device 110 during the idle time Ti, and a history management module 1320 which generates a history including the preemptively searched target read bias (TRB).

Also, the memory controller 120 in accordance with an embodiment may further include a read count management module 1330 which monitors the read count value READ_COUNT and compares it with the threshold value TH to check whether or not a condition for executing the preemptive history generation technique is met, and a memory block address management module 1340 which manages saving and loading of a memory block address.

Figure 14:
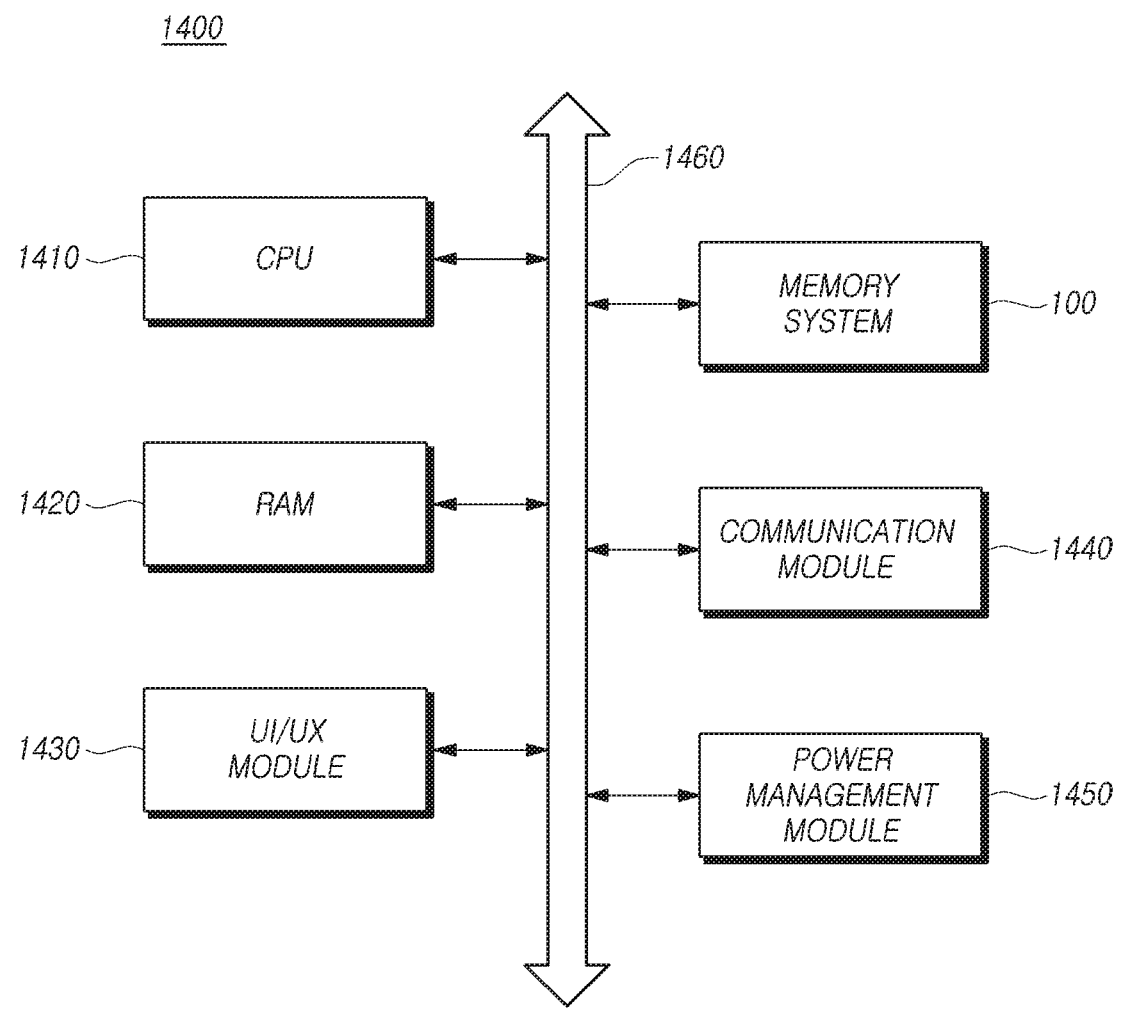
FIG. 14 is a block diagram schematically illustrating a computing system in accordance with an embodiment of the present invention.

FIG. 14 is a block diagram schematically illustrating a computing system 1400 in accordance with an embodiment.

Referring to FIG. 14, the computing system 1400 may include a memory system 100, a central processing unit (CPU) 1410, a RAM 1420, a UI/UX (user interface/user experience) module 1430, a communication module 1440 based on at least one communication scheme and a power management module 1450 which are electrically coupled to a system bus 1460.

The computing system 1400 may include a PC (personal computer), a mobile terminal such as a smartphone, a tablet or any of various other electronic devices.

The computing system 1400 may further include a battery for supplying an operating voltage, and may further include an application chipset, a graphic-related module, a camera image processor (CIS), a DRAM and the like. The computing system 1400 may include other components.

The memory system 100 may be of any of multiple types. For example, the memory system 100 may include a device which stores data in a magnetic disk, such as a hard disk drive (HDD). In another example, the memory system 100 may include a device which stores data in a nonvolatile memory, such as a solid state drive (SDD), a universal flash storage (UFS) device and/or an embedded MMC (eMMC) device. The nonvolatile memory may include any of a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM). In addition, the memory system 100 may be realized into various types of storage devices, and may be mounted in various electronic devices.

The embodiments described above may provide the memory system 100, the memory controller 120 and an operating method thereof with the capability to execute high speed data recovery when a read fail of data occurs.

Also, the embodiments may provide the memory system 100, the memory controller 120 and an operating method thereof with the capability of quick and effective data recovery when a read fail of data occurs, by preemptively searching for the optimal target read bias for read retry of data.

Further, the embodiments may provide the memory system 100, the memory controller 120 and an operating method thereof with the capability of preemptively searching for the optimal target read bias to be used in a read operation of data, in consideration of a degradation or distortion state of a memory device.

Although various embodiments have been illustrated and described, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the invention. The invention is not limited by the embodiments and the accompanying drawings. The invention covers the disclosed embodiments and all variations, modifications, additions and substitutions falling within the scope of the appended claims and their equivalents.

What is claimed is:

1. A memory system comprising:
a memory device including a plurality of memory blocks; and
a memory controller configured to control the memory device,
wherein, during an idle time, the memory controller searches for a target read bias which is applied to a first word line among a plurality of word lines in a first memory block of the memory device to perform a read operation, and generates a history including the target read bias, and
wherein a normal operation is not performed during the idle time.

2. The memory system according to claim 1, wherein the first word line corresponds to an outermost word line among the plurality of word lines in the first memory block.

3. The memory system according to claim 1, wherein the first word line corresponds to a word line adjacent to a dummy word line among the plurality of word lines in the first memory block.

4. The memory system according to claim 1, wherein the first word line is the weakest of the plurality of word lines.

5. The memory system according to claim 1, wherein the memory controller searches for the target read bias for the first word line among the plurality of word lines in the first memory block, as a representative target read bias for the first memory block.

6. The memory system according to claim 1, wherein the memory controller searches for the target read bias for the first word line among the plurality of word lines in the first memory block, as a representative target read bias for a word line group including the first word line.

7. The memory system according to claim 1, wherein, when a read count value for the first memory block based on a read operation for one page in the first memory block is equal to or greater than a threshold value, the memory controller searches for the target read bias for the first word line in the first memory block, during the idle time.

8. The memory system according to claim 7, wherein the threshold value is set to be smaller than a degradation-related read count value corresponding to the first memory block.

9. The memory system according to claim 1, wherein the memory controller performs a read retry operation based on the target read bias by referring to the history upon a read fail for one page in the first memory block.

10. A memory controller comprising:
a host interface configured to communicate with a host;
a memory interface configured to communicate with a memory device; and
a control circuit configured to control an operation of the memory device,
wherein, during an idle time of the memory device, the control circuit searches for a target read bias applied to a first word line among a plurality of word lines in a first memory block of the memory device to perform a read operation, and generates a history including the target read bias, and
wherein a normal operation is not performed during the idle time.

11. The memory controller according to claim 10, wherein the control circuit generates the history by a unit of a memory block.

12. The memory controller according to claim 10, wherein the control circuit generates the history by a unit of a word line group.

13. The memory controller according to claim 10, wherein the first word line is an outermost word line among the plurality of word lines in the first memory block.

14. The memory controller according to claim 10, wherein the first word line is adjacent to a dummy word line.

15. The memory controller according to claim 10, wherein the first word line is the weakest of the plurality of word lines in the first memory block.

16. A method for operating a memory controller, the method comprising:
searching for a target read bias applied to a first word line among a plurality of word lines in a first memory block of a memory device to perform a read operation, during an idle time of the memory device; and
generating a history including the target read bias,
wherein a normal operation is not performed during the idle time.

17. The method according to claim 16, further comprising, before the searching:
determining whether a read count value for the first memory block based on a read operation for one page in the first memory block is equal to or greater than a threshold value;
saving a memory block address for the first memory block when the read count value is equal to or greater than the threshold value;
determining whether it is the idle time;
loading the memory block address for the first memory block when it is the idle time; and
checking whether or not the history exists, wherein the searching is performed when the history does not exist.

18. The method according to claim 16, wherein the first word line corresponds to an outermost word line among the plurality of word lines in the first memory block.

19. The method according to claim 16, wherein the first word line corresponds to a word line adjacent to a dummy word line among the plurality of word lines in the first memory block.

20. The method according to claim 16, further comprising performing a read retry operation using the target read bias by referring to the history, upon a read fail for one page in the first memory block.

* * * * *